United States Patent [19]
Hash

[11] Patent Number: 5,134,400
[45] Date of Patent: Jul. 28, 1992

[54] MICROWAVE MULTIPLYING D/A CONVERTER

[75] Inventor: Ronald J. Hash, Palm Bay, Fla.

[73] Assignee: Harris Corporation, Melbourne, Fla.

[21] Appl. No.: 637,826

[22] Filed: Jan. 7, 1991

[51] Int. Cl.⁵ .............................................. H03M 1/78
[52] U.S. Cl. ...................................... 341/136; 341/154
[58] Field of Search ............... 341/144, 153, 154, 136, 341/133

[56] References Cited

U.S. PATENT DOCUMENTS

| | | |
|---|---|---|
| 3,307,173 | 2/1967 | Popodi et al. |
| 3,728,719 | 4/1973 | Fish .................. 341/154 X |
| 4,161,783 | 7/1979 | Wrench, Jr. et al. |
| 4,311,988 | 1/1982 | Kelley et al. |
| 4,415,883 | 11/1983 | von Sichart .......... 341/154 X |
| 4,553,132 | 11/1985 | Dingwall et al. |
| 4,631,522 | 12/1986 | Cabot ................ 341/154 X |
| 4,635,038 | 1/1987 | Wincn ............... 341/154 X |
| 4,661,802 | 4/1987 | Yukawa .............. 341/153 X |
| 4,683,458 | 7/1987 | Hallgren ............. 341/154 X |
| 4,689,607 | 8/1987 | Robinson . |
| 4,713,649 | 12/1987 | Hino . |
| 4,745,393 | 5/1988 | Tsukada et al. |
| 4,779,029 | 10/1988 | Henderson et al. |
| 4,800,365 | 1/1989 | White et al. |
| 4,816,830 | 3/1989 | Cooper .............. 341/153 |
| 4,851,839 | 7/1989 | Reinke . |

Primary Examiner—Sharon D. Logan
Attorney, Agent, or Firm—Evenson, Wands, Edwards, Lenahan & McKeown

[57] ABSTRACT

A digital to analog converter circuit for use at RF frequencies includes an input transimpedance buffer receiving an RF input. A complimentary switched R2R ladder network is coupled to the input buffer at one end and to an output transimpedance circuit at its other end. The output transimpedance circuit has an extremely low impedance and provides an RF output. The switched ladder network is formed of transistors and includes a complimentary switch to maintain current and voltage regardless of the transistor states. A biphase D/A converter uses a mirrored complimentary switched R2R ladder network coupled between a phase splitter and the output transimpedance circuit.

14 Claims, 3 Drawing Sheets

MICROWAVE MULTIPLYING D/A CONVERTER

BACKGROUND AND SUMMARY OF THE INVENTION

This invention relates to microwave circuits and, more particularly, to a circuit allowing highly-accurate digital control of signal levels for various system applications.

Digital to analog (D/A) converters are well known for low-frequency applications. Prior art FIG. 1 illustrates a typical D/A low-frequency converter 10 including input buffer 12 and output buffer 20. These buffers 12, 20 can be, for example, operational amplifiers (op amps). A switched resistor ladder network, indicated by dashed lines 15, is coupled between the input buffer 12 and the output buffer 20. The input buffer 12 provides the required input/output impedances and buffering for the switched resistor ladder network 15. The ladder network 15 establishes the digitally-weighted voltages for the D/A converter 10.

The switched resistor ladder network 15 is formed of a series coupling of resistors 14 coupled at one end to the output of op amp 12. At the other end, the series coupling of resistors 14 are coupled through a further resistor 17 to ground. The resistors 14 have a resistive value of "R" and the resistor 17 has a value of "2R". Forming the ladder steps between each of the series coupled resistors 14 is a series circuit of a resistor 16 having a resistive value of "2R" and a switch 18. These steps are coupled at their resistive side between the resistors 14 and at the switch side to an input of the output op amp 20. The number of ladder steps "n" or the converter "resolution" is equal to the number of bits ($b_1$–$b_n$) in the digital control word.

In operation of the circuit of prior art FIG. 1, the input buffer 1 provides high-output impedance and isolation from the voltage source (not shown). The output buffer 20 provides a virtual ground (GND) at the voltage summing node for eliminating impedance dependent summation. The bits $b_1$–$b_n$ are selected by closing their respective switches 18. Those bits which are not selected are grounded to maintain the internal impedances of the circuit constant. This type of typical D/A converter using an "R2R" ladder network has a limited frequency range resulting from the parasitic nature of the buffers 12 and 20 and switch devices 18. Because the frequency limit is restricted to operation in the low hundreds of MHz, high-frequency microwave applications are not possible.

Due to the unavailability of a microwave D/A converter, current methods involve using a DC D/A converter followed by buffers and linearizing circuitry which drives a voltage controlled attenuator. In these circuits, the attenuation is proportional to the DC control voltage. Typically however, the proportionality is non-linear. Therefore, lookup tables are provided to store the data for the attenuator versus control voltage. These lookup tables were formed of programmable read-only memories (PROMS) or in other software solutions to aid in the linearization. However, this circuitry is often too slow or requires a very hardware intensive circuit. This consequently increases the cost and labor involved in developing precise control of microwave signals.

There is therefore needed a circuit for allowing highly-accurate digital control of microwave signal levels for various system applications. The circuit should reduce the number of components, size, complexity and power requirements while still providing a low-cost system having improved performance over the prior known devices.

The present invention meets these needs by providing a D/A converter circuit which operates using components available for broad-band microwave operation. The invention provides a digital-to-analog converter circuit for use at RF frequencies, including an input transimpedance buffer receiving an RF input, a complimentary switched R2R ladder network coupled to the input buffer, and an output transimpedance circuit having an extremely low input impedance, coupled to the ladder network and providing an RF output.

It is an advantage of the present invention to provide a microwave multiplying D/A converter using minimal components. This eliminates the need for interface components, such as lookup tables and buffers, previously employed for precise microwave signal control.

It is a further advantage to provide a microwave frequency operating D/A converter offering extreme broadband performance on the order of 12 GHz.

Other objects, advantages and novel features of the present invention will become apparent from the following detailed description of the invention when considered in conjunction with the accompanying drawings.

BRIEF DESCRIPTION OF THE DRAWINGS

Prior art

DETAILED DESCRIPTION OF THE DRAWINGS

Figure 1:
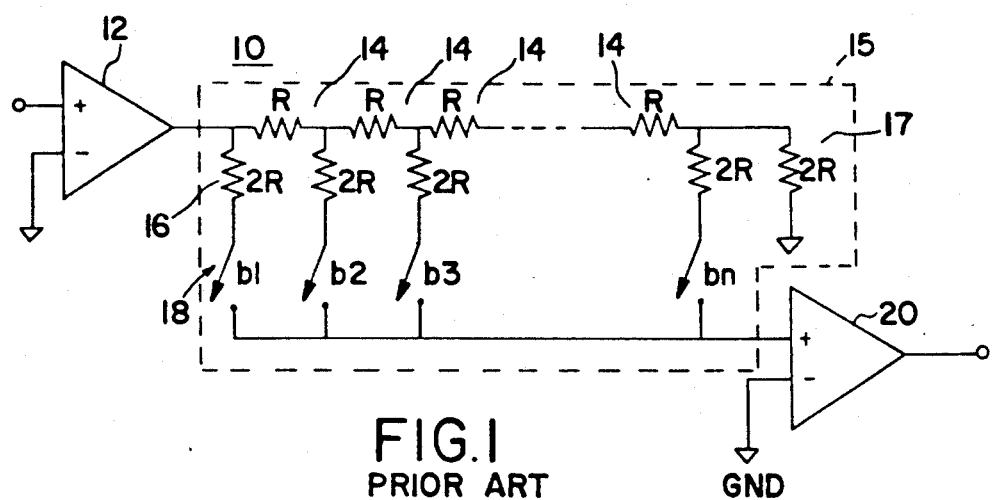
FIG. 1 illustrates a typical D/A converter circuit.
Figure 2:
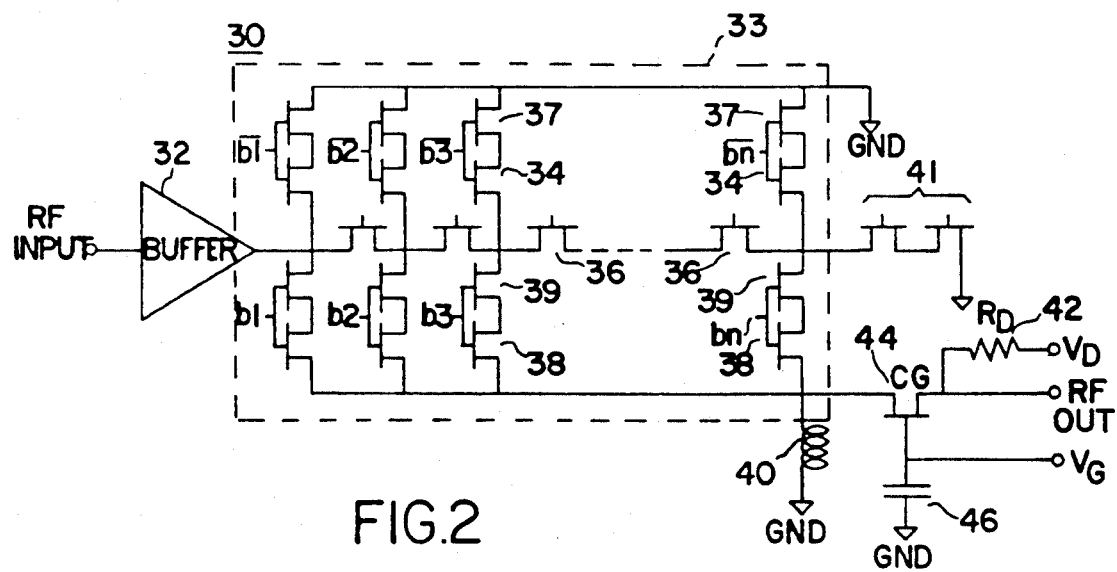
FIG. 2 is a schematic diagram of a circuit according to the present invention.

Referring to FIG. 2, there is shown a multiplying D/A converter circuit 30 for operation at microwave frequencies. An RF input is provided to an input transimpedance or transconductance buffer 32. The transimpedance buffer is used because operational amplifiers or differential amplifiers do not operate properly in the microwave frequency range. The output from the transimpedance buffer 32 is then provided to a ladder network indicated by dashed lines 33. The ladder network 33 includes a number of series-coupled transistors 36 which are coupled at one end to the output of transimpedance buffer 32. Because of the microwave signal leakage from the transistors 36, their size is reduced to a point such that their internal resistance may be used as the resistive value "R" of the R2R ladder network 33 in terms of the typical prior art circuit shown in FIG. 1. Similarly, two identical series coupled transistors 41, forming a resistive value "2R", are coupled between the other end of the series coupling of transistors 36 and ground to terminate the ladder network.

A first set of steps of the ladder network 33 are formed of two of the same type of transistors 38 and 39 coupled in series to achieve a resistance value of 2R. Using transistors of the same type as the series coupled transistors 36 maintains a tight two to one ratio tolerance, i.e. 2R to R, required for operational accuracy. These ladder steps are coupled at one end between the transistors 36 forming the series coupling. At their other end, the transistors 38 and 39 are coupled to an output transimpedance circuit including a transistor 44. The transimpedance buffer provides the necessary isolation and low-impedance summing node. A second set of ladder steps are formed of series couplings of two transistors 34 and 37. Again, one end of the steps formed by transistors 34 and 37 ar coupled between the transistors 36. The other end of the steps are coupled to ground.

The bits $b_1-b_n$ of the digital control word are selected by properly biasing the ladder steps of the series-coupled transistors 38 and 39. When the steps ar not biased to conduct the output of the transimpedance buffer 32, the signal is grounded through transistors 34 and 37 to maintain the internal impedances of the circuit constant.

The complimentary sets of dual transistor switches form a split ladder which operates in a voltage mode. The transistor switches 34, 37, 38 and 39 can be MESFET or HEMT devices designed to operate in bandwidths ranging from the DC to the lower EHF region. Similarly, transistors 36 and 41 can also be MESFET or HEMT devices. The use of the complimentary switches formed by transistors 38 and 39 and 34 and 37, respectively, maintains the current and voltage regardless of the transistor states. The series coupling of transistors 36 are always biased "on."

The output from the dual transistor switches 38 and 39 is provided to the transistor 44 of the output transimpedance circuit and an inductance 40. The inductance 40 can be a surface-mount component, such as a spiral inductor, providing a DC ground for transistor 44 and further reducing the summing node impedance. The transistor 44 is biased by a voltage $V_D$ applied through a resistor 42. The gate of the transistor 44 couples through capacitor 46 to ground. It is understood that capacitor 46 is only used for providing a DC block for gate bias, however, the capacitor is not necessary for proper operation. The capacitor 46 and resistor 42 can be thin film devices. Output from the transistor 44 is the RF output signal.

Figure 3:
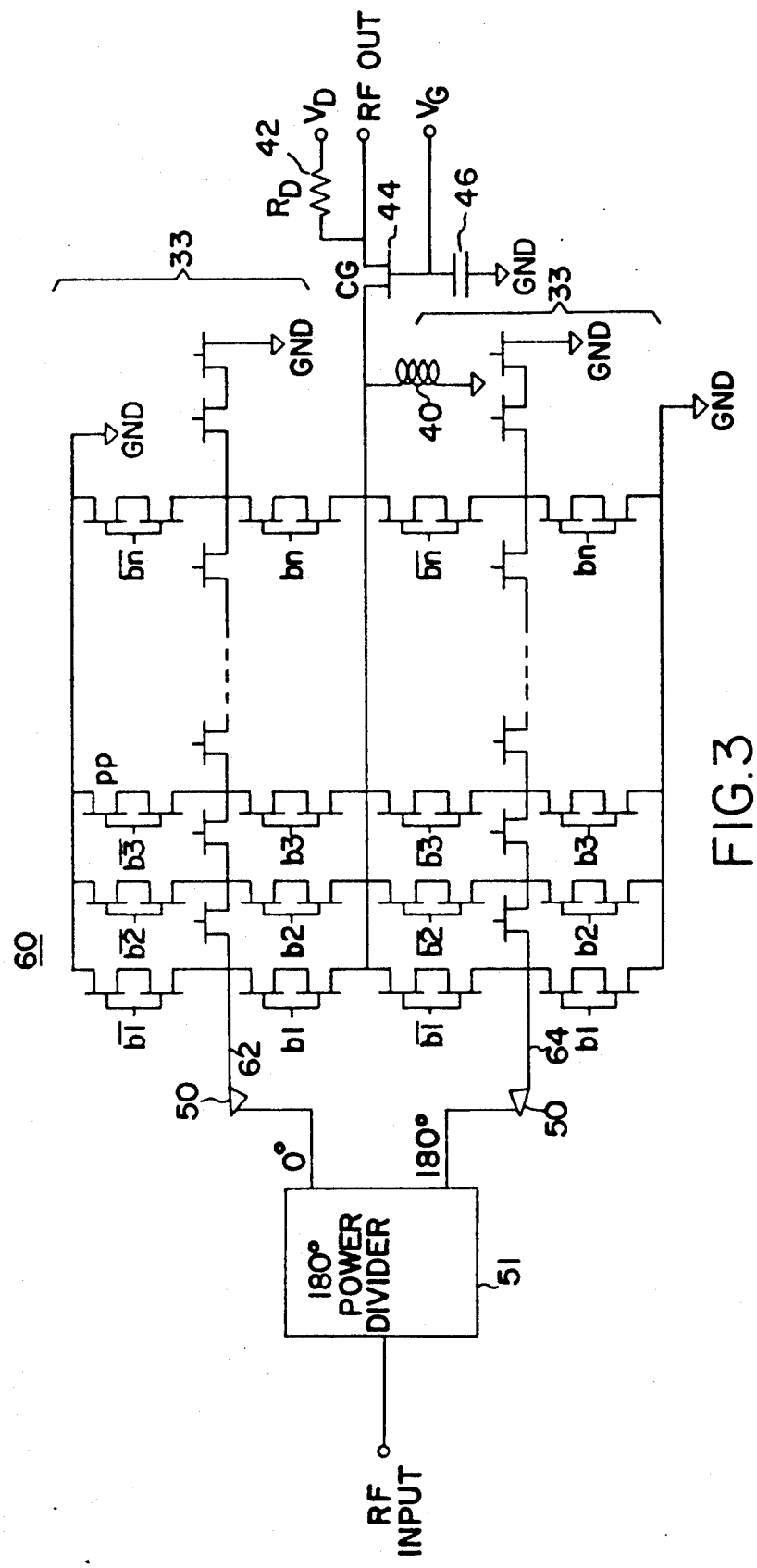
FIG. 3 is a schematic diagram of a bi-phase D/A converter according to the present invention.

Referring to FIG. 3, there is shown a bi-phase multiplying D/A converter circuit operable at microwave frequencies. The RF input is shown supplied to a phase splitter 51 which generates both in-phase 62 and out-phase 64 signals, i.e. 0° and 180° signals. These antiphase, equal amplitude signals pass through buffers 50 to drive mirror imaged resistive ladder networks 33 identical to the ladder network 33 shown in FIG. 2. Through the use of the bi-phase ladder networks, high-frequency microwave signal leakage to the summing node is canceled. Again, an output transimpedance circuit including transistor 44, inductor 40, resistor 42 and capacitor 46 is formed at the output of the ladder network 33.

In operation, when moderate device leakage levels in the range of $-30$ to $-40$ dB are required and no 180° phase shift capability is necessary, then the D/A converter of FIG. 2 provides precise digital control of signal levels while being more compact and less costly due to the minimum amount of components necessary. Alternately, if a lower device leakage level in the range of, for example, $-70$ to $-80$ dB is required and/or a 180° phase shift capability is necessary, then the bi-phase D/A converter shown in FIG. 3 provides optimum performance by canceling high-frequency leakage which results at the summing node.

Both circuits offer extremely broadband performance which may be, for example, greater than 12 GHz. Further, the circuits may be realized as monolithic microwave integrated circuits (MMIC).

Figure 4:
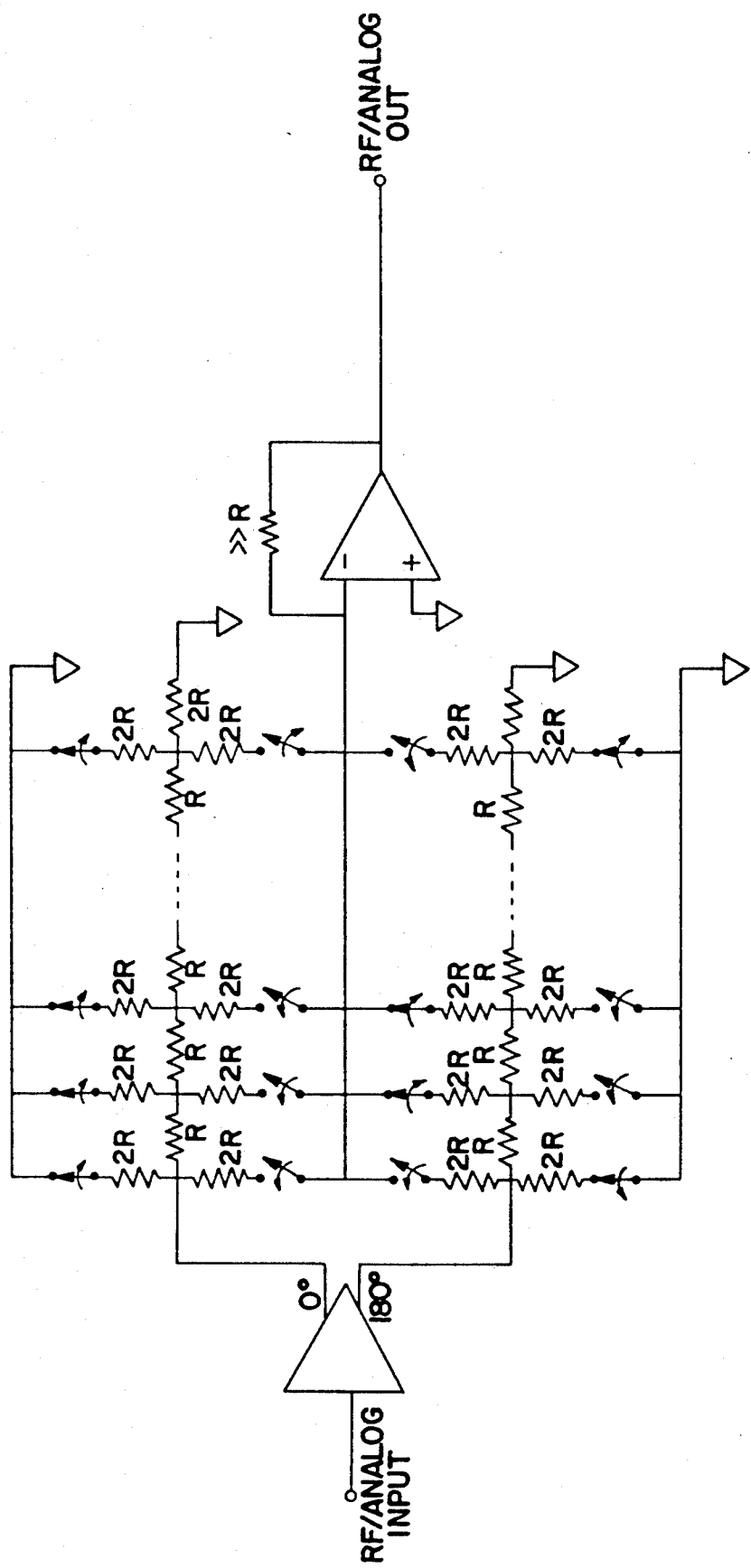
FIG. 4 is a schematic diagram of another embodiment according to the present invention.

The balanced R2R ladder network of FIG. 3 can also be formed of simple resistors (FIG. 1) to obtain a D/A converter operable for any frequency range as shown in FIG. 4. In order to do so, the phase splitter and output transimpedance circuit would be replaced with differential amplifiers. Again, as with FIG. 3, a common output path would couple the mirrored R2R ladder network to the output differential amplifier.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. A digital to analog converter circuit for use at RF frequencies, comprising:
   an input transimpedance buffer receiving an RF input;
   a complimentary switched R2R ladder network coupled to said input buffer; and
   an output transimpedance circuit having an extremely low impedance coupled to said ladder network and providing an RF output.

2. A digital to analog converter circuit according to claim 1, wherein said output transimpedance circuit comprises:
   an output transistor having a source coupled to said complimentary switched R2R ladder network;
   a biasing circuit coupled in series between a gate of said output transistor and ground;
   an inductance coupling at one end to said complimentary switched R2R ladder network and to said source of said transistor and at another end to ground; and
   a biasing path coupling a voltage source to a drain of said transistor, said transistor drain providing the RF output.

3. A digital to analog converter circuit according to claim 2, wherein said output transistor is an FET transistor.

4. A digital to analog converter circuit according to claim 2, wherein said complimentary switched R2R ladder network comprises a plurality of identical transistors operatively coupled to form said complimentary switched R2R ladder network.

5. A digital to analog converter circuit according to claim 4, wherein a series coupling of said plurality of transistors form the R portions of said R2R ladder network and are biased in a continuous on state.

6. A bi-phase multiplying digital to analog converter circuit for RF frequencies, comprising:
   an input phase splitter receiving an RF input and providing in-phase and out-phase signals;
   a first complimentary switched R2R ladder network coupled to said in-phase signal and having a common output path;
   a second complimentary switched R2R ladder network mirroring said first complimentary switched R2R ladder network coupled to said out-phase signal, and sharing said common output path; and
   an output transimpedance circuit having an extremely low impedance coupled to said common output path and providing an RF output.

7. A bi-phase multiplying digital to analog converter circuit according to claim 6, wherein said output transimpedance circuit comprises:
- an output transistor having a source coupled to said common output path;
- a biasing circuit coupled in series between a gate of said output transistor and ground;
- an inductance coupling at one end to said common output path and to said source of said transistor and at another end to ground; and
- a biasing path coupling a voltage source to a drain of said transistor, said transistor drain providing the RF output.

8. A bi-phase multiplying digital to analog converter circuit according to claim 6, wherein said output transistor is an FET transistor.

9. A bi-phase multiplying digital to analog converter circuit according to claim 7, wherein said first and second complimentary switched R2R ladder networks comprise a plurality of identical transistors operatively coupled to form said first and second complimentary R2R ladder network.

10. A bi-phase multiplying digital to analog converter circuit according to claim 9, wherein a series coupling of said plurality of transistors form the R portion of said first and second complimentary switched R2R ladder networks and are biased in a continuous state.

11. A digital to analog converter circuit, comprising:
- an input differential amplifier receiving an input signal and providing an output signal;
- a first complimentary bi-phase R2R ladder network coupled to said output signal and having a common output path;
- a second complimentary bi-phase R2R ladder network mirroring said first complimentary bi-phase R2R ladder network coupled to said output signal, and sharing said common output path to provide a balanced R2R ladder circuit; and
- an output differential amplifier having an extremely low impedance coupled to said common output path and providing a converter circuit output, whereby said digital to analog converter circuit provides leakage cancellation.

12. A digital to analog converter circuit according to claim 11, wherein said first and second complimentary bi-phase R2R ladder networks are formed of resistors.

13. A method for converting digital to analog signals for microwave frequencies, the method comprising the steps of:
a) receiving an RF input signal in an input transimpedance buffer;
b) providing a digital control signal as an input to a complimentary switched R2R ladder network coupled to said input buffer; and
c) operating an output transimpedance circuit at an extremely low impedance, coupled to said switched ladder network, to provide a analog RF output.

14. A method for bi-phase conversion of digital to analog signals for microwave frequencies, the method comprising the steps of:
a) splitting an RF input signal into an in-phase and out-phase signal;
b) providing a digital control signal as an input to a mirrored set of complimentary switched R2R ladder networks, a first of said mirrored set being coupled to said in-phase signal and a second of said mirrored set coupled to said out-phase signal, said mirrored set of complimentary R2R ladder networks having a common output path; and
c) operating an output transimpedance circuit at an extremely low impedance, coupled to said common output path, to provide an analog RF output.

* * * * *